United States Patent [19]

DiGenova

[11] Patent Number: 4,746,389
[45] Date of Patent: May 24, 1988

[54] METHOD FOR PRODUCING A CLEAN, HIGHLY CONDUCTIVE SURFACE FOR MATING COMPOSITE ARTICLES

[75] Inventor: Rocco R. DiGenova, Wallingford, Conn.

[73] Assignee: United Technologies Corporation, Hartford, Conn.

[21] Appl. No.: 81,192

[22] Filed: Aug. 4, 1987

[51] Int. Cl.⁴ ............................................. B32B 31/18
[52] U.S. Cl. .................................. 156/247; 156/245; 156/344; 264/139; 264/344
[58] Field of Search ............... 156/247, 344, 245, 584; 264/139, 344

[56] References Cited

U.S. PATENT DOCUMENTS 4,661,186  4/1987  DeBernardi ..................... 156/344 X
4,685,987  8/1987  Fick ..................................... 156/247
4,707,207  11/1987  Baus ................................. 156/344 X Primary Examiner—Robert A. Dawson

[57] ABSTRACT

A method is disclosed for providing a clean, highly conductive mating surface in a composite panel which includes an embedded aluminum wire mesh to achieve lightning and electromagnetic interference shielding. The method includes the steps of laying a nonporous tape in a mold corresponding with the area requiring a highly conductive mating surface, laying one or more plies of aluminum mesh thereover to provide a conductive path, and then laying a nonporous barrier tape ply above the mating surface, sandwiching the metal mesh therebetween, with structural plies laid thereover. During curing, the tapes prevent direct resin inclusion into the metal mesh. After curing, the nonporous tape is removed to expose the clean, highly conductive mating surface. Utilizing the above-described method substantially increases the ability to provide a clean conductive mating surface without utilizing extensive equipment or processing steps, providing enhanced EMI shielding in composite structures.

23 Claims, 2 Drawing Sheets

FIG. 1
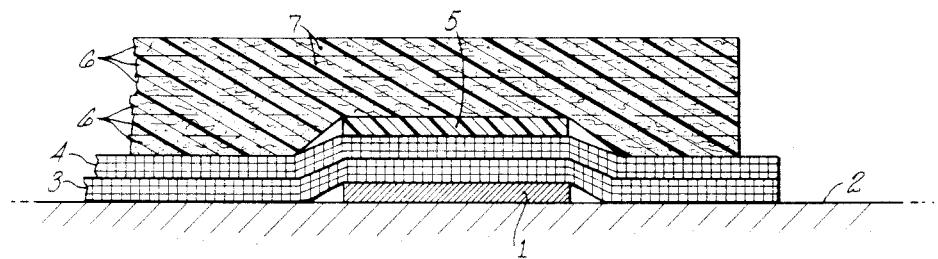
FIG. 1A
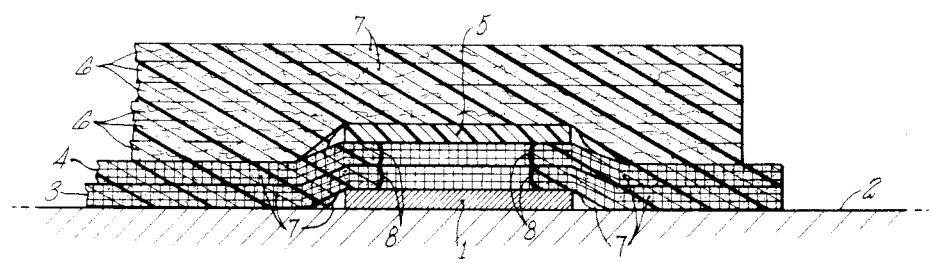
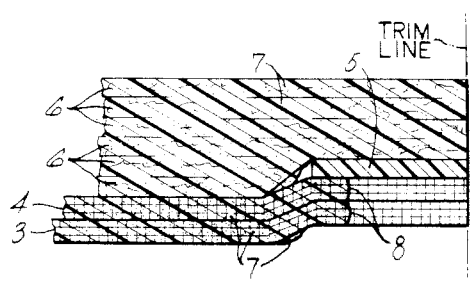
FIG. 2

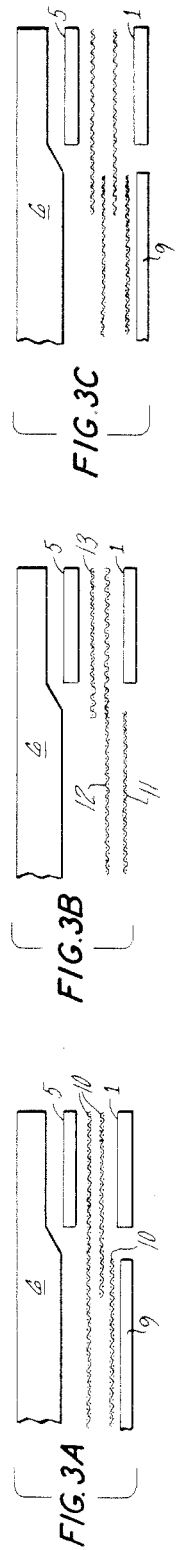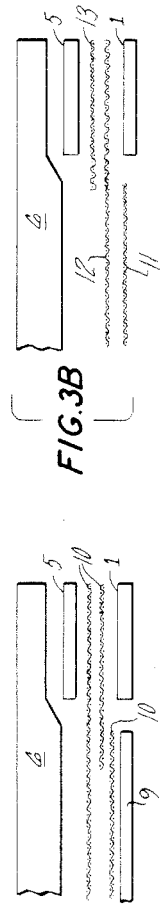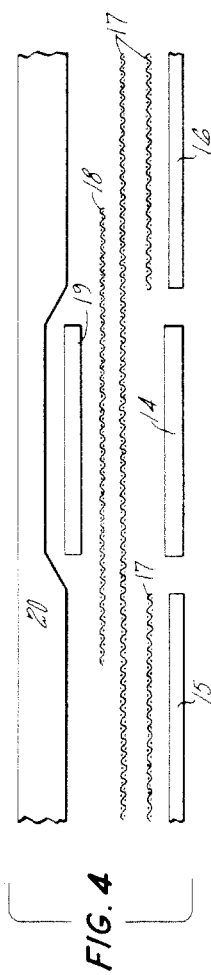

METHOD FOR PRODUCING A CLEAN, HIGHLY CONDUCTIVE SURFACE FOR MATING COMPOSITE ARTICLES

This invention was made with Government supoort under a contract awarded by the Department of the Navy. The Government has certain rights in this invention.

DESCRIPTION

1. Technical Field

This invention relates to a method for producing a clean, highly conductive electrical bonding surface in a composite article for providing continuous electromagnetic shielding with adjacent articles.

2. Background Art

Electromagnetic environmental effects, described alternately as electromagnetic interference (EMI), electromagnetic pulse (EMP), electromagnetic vulnerability (EMV), etc., refers to the susceptibility of electronic devices to external electromagnetic fields. These effects, hereinafter referred to collectively as EMI, affect electronic devices by causing current fluctuations which result in unexpected switching within microprocessor units and semiconductor chips. Since advanced chips utilize increased speed at lower current draws than older chips, electronic devices incorporating these chips are more susceptible to damage from EMI, particularly in applications with a high density of electronics, such as aircraft.

A related problem is lightning strikes. While aircraft lightning strikes are not uncommon, most aircraft utilize an aluminum skin which shields critical internal electronic devices from damage. With the trend towards utilizing composite aircraft structures, there is concern that lightning strikes may jeopardize aircraft safety. Since composites are not good conductors, they cannot shield interior circuits, and a lightning strike may move directly along internal conductors and detrimentally effect the flight avionics. The development of digital engine controls, fly by wire flight controls and artificial stabilization have made these avionics packages more central to aircraft safety and less able to survive even brief interruptions of function.

A common method of mitigating the potential damage from EMI is the inclusion of a continuous conductive shield around sensitive electronic systems. Several methods exist for providing this shielding on an aircraft using composite components. One method involves the ion vapor deposition of a conductive metal, such as aluminum, onto the composite surface. However, ion vapor deposition requires processing in a vacuum chamber, hence, part size is limited and the processing itself is relatively expensive. In addition, effective ion vapor deposition is highly dependent on proper surface preparation and the metallized surfaces are susceptible to impact damage and wear.

Another method utilizes electroless plating onto the part surface. Electroless plating processes involve immersion in a series of solutions and consequently part size is limited to tank size. This currently excludes the larger aircraft structures, and again, these surfaces are susceptible to impact damage and wear.

Another method requires embedding conductive metal mesh, such as aluminum wire mesh, in the composite article during fabrication. This provides a conductive layer while utilizing standard composite parts fabrication processes. Presently EMI and lightning strike protection for aircraft composite structures is provided by embedding a woven aluminum mesh on or under the surface of the structure. The structure may be fabricated by including a first layer of aluminum wire mesh in a mold with a plurality of composite prepreg laminates built-up thereover. During molding, resin flows into the voids of the mesh under an even pressure, integrating the structure. While providing excellent conductive properties within a single composite article, problems arise in achieving complete conductance bonding between two adjacent composite articles due to the resin impregnation of the metal mesh. Presently, excess resin is sanded away along the mating surface to expose the metal mesh and provide an electrical bonding surface. However, sanding does not provide a completely resin free surface, resulting in higher resistances and reduced shielding effectiveness. The sanding operating is also sensitive to mechanical proficiency and may cause damage to the aluminum wire mesh. Consequently, shielding effectiveness may vary from part to part, which is unacceptable in many critical applications. Therefore, a method is needed within the art to provide a clean, highly conductive surface for mating with adjacent articles while minimizing production and equipment requirements.

DISCLOSURE OF INVENTION

According to the present invention, a method is disclosed for providing a highly conductive surface on a composite article for mating with adjacent articles, the composite article utilizing an embedded metal mesh to achieve lightning and electromagnetic interference protection. The method comprises the steps of laying a nonporous tape in a mold corresponding with the mating surface of the composite article, laying a ply of metal mesh thereover to provide a conductive path over the nonporous tape, laying a barrier tape corresponding with the mating surface of the composite structure over the metal mesh, sandwiching the mesh therebetween, stacking structural composite plies over the barrier tape and metal mesh, curing to form a composite article, and removing the nonporous tape to expose a clean, highly conductive mating surface.

Utilizing the barrier tape above and the nonporous tape below the bond line surface prevents excessive resin inclusion in the metal mesh. However, indirect resin flow may be allowed to secure the mesh edge which may be trimmed after cure. After fabrication, the nonporous tape is removed to expose clean metal mesh along the mating surface for engaging adjacent articles, which may also be composite structures with corresponding clean metal mesh surfaces. Utilizing the above method provides a substantial improvement in mating surface conductivity by reducing surface resin content while minimizing production or processing steps. Such a method provides a simple and efficient means of ensuring adequate EMI and lightning strike protection across the joints of aircraft composite structures.

BRIEF DESCRIPTION OF DRAWINGS

FIG. 1 is a cross section illustrating a mold and layup of an article incorporating the nonporous and barrier tapes of the present invention, prior to molding.

FIG. 1A illustrates the article after consolidation.

FIG. 2 is a cross section illustrating the final article configuration after molding and trimming.

FIG. 3A, 3B and 3C illustrate alternative oly layup configurations utilizing the oresent invention.

FIG. 4 illustrates a clean, highly conductive surface provided mid-part utilizing the method of the present invention.

BEST MODE FOR CARRYING OUT THE INVENTION

Referring to FIG. 1, an uncured composite article is shown prior to molding. For illustrative purposes, the article requires a clean, highly conductive edge surface. It should be noted that the thicknesses shown are exaggerated for ease in illustration. A nonporous tape 1 is laid onto a tool or mold surface 2 in an edge area required for conductive bonding with adjacent articles. For purposes of this disclosure, "bonding" means connecting various structures so that these structures form a continuous electrical unit, preventing buildup of electricity on one structure by discharging to the other structures. For illustrative purposes, the tape 1 is CHO-MASK TM tape made by the Chomerics Company, which includes a conductive adhesive backing on a copper foil with a Mylar facing. A nonporous tape is required to prevent resin infiltration. While CHO-MASK TM tape is discussed, any nonporous material which would survive fabrication and be removable from the completed article could be used. A metal mesh ply 3 is then laid over the tape 1, with the metal mesh possibly being of an expanded aluminum foil or wire variety. For example, an aluminum wire mesh formed from 0.0021 inch diameter wire, composed of 5056-0 aluminum and weaved at a wire density of 200 wires per inch may be used. Another metal mesh ply 4 is laid over the first mesh ply 3. The number of metal mesh plies employed will depend upon the degree of shielding required for the particular application. While two metal mesh plies are shown, any number of metal mesh plies may be used.

After the metal mesh is installed, a barrier tape 5 is included above the nonporous tape, sandwiching the metal mesh between the tapes. The barrier tape provides a barrier to prevent direct resin inclusion into the metal mesh. For illustrative purposes, the barrier tape comprises a low flow film adhesive (AF126-2) purchased from the 3M Company, which serves as an effective resin barrier while providing a good internal bond within the laminate. While a film adhesive is disclosed, any barrier material which would prevent direct resin inclusion and be compatible with the resin/fiber combination and molding process may be used. For example, a Mylar ® tape, with or without an adhesive peel ply backing could be used. One or more structural plies 6 are then laid over the wire mesh plies and the barrier tape. Such plies may comprise resin preimpregnated fiberglass, Kevlar ®, graphite or other hybrid laminates. After the desired plurality of structural plies are installed, the assembly is vacuum bagged, placed in the appropriate autoclaving device, heated under pressure and cured.

During the cure cycle, a resin 7 flows through the plies to ensure consolidation into a single article. As illustrated in FIG. 1A, the barrier tape prevents the resin flow from directly infiltrating the metal mesh along the mating surface. However, the barrier tape does allow indirect resin flow along the ply edges 8 to prevent ply shifting. After curing, the article is removed from the mold and the edge trimmed by cutting through the barrier tape, metal mesh and nonporous tape. The CHO-MASK tape is then peeled off, revealing a clean edge mesh suitable for conductive joining to adjacent structures. In the case of exposed aluminum mesh, alodining may be performed to provide corrosion protection to the mating surface while still permitting electrical conductivity. The article may then be mated to the adjoining article using metal straps or bolts to assure a continuously conductive joint. FIG. 2 illustrates the part shape after edge trimming.

In addition to the above-described part configuration, various other embodiments may utilize the present invention. Referring to FIG. 3A, a configuration utilizing overlapped metal mesh plies is shown. FIG. 3A utilizes a face ply 9 of the chosen composite, such as fiberglass prepreg, is placed adjacent to the nonporous tape 1 for protecting the underlying metal mesh 10 from impact damage. For ease in illustration, FIGS. 3A, 3B and 3C are shown in exploded fashion. Referring to FIG. 3B, a configuraion utilizing a single metal mesh face ply 11, with a continuous ply 12 and a segmented mesh ply 13 laid thereover. No protective face ply is used. In FIG. 3C, a configuration utilizing double overlapped metal mesh plies is shown. While illustrative of various alternative embodiments, it will be understood by those skilled in the art that the present invention is not limited to the embodiments shown and that any prepreg layup or filament wound composite structure utilizing metal mesh for EMI/lightning protection and requiring electrical bonding to an adjoining article could utilize this invention. In addition, the present invention is contemplated to have application in many areas due to the wide usage of electronic devices subject to EMI, including but not limited to automotive and household uses which require electrical bonding of composite structures.

Referring to FIG. 4, an article requiring a mid-part conductive surface is shown, produced according to the present invention. A nonporous tape ply 14 is applied along a desired mating surface, with a first face ply 15 mating on one side and a second face ply 16 mating on the other side. A plurality of metal mesh plies are laid over the face plies and tape, either continuously or in segment with an overlay metal mesh ply 18 laid thereover. A barrier tape 19 is applied along the mating surface, over the nonporous tape 14, sandwiching the metal mesh therebetween. This prevents direct resin inclusion into the mesh during curing. A plurality of structural plies 20 are laid thereover and the assembly cured. After curing the nonporous tape is removed exposing the clean metal mesh surface.

While this invention has been shown and described in relation to a method of EMI/lightning shielding of aircraft, it will be understood by those skilled in the art that any other applications requiring electromagnetic shielding may utilize the present invention. In addition, while a conductive mating surface has been discussed, it will be understood that any shape conductive mating surface may be provided by simply tailoring the barrier and nonporous tapes. For example, square, round or oblong shapes may be produced.

I claim:

1. A method for producing a composite article which includes a clean, highly conductive mating surface for conductively bonding with adjacent structures, said article including a continuous conductive layer for lightning or electromagnetic interference shielding, said method comprising:

(1) placing a nonporous tape in a mold in an area requiring the mating surface;

(2) overlaying the nonporous tape with at least one layer of conductive material;

(3) placing a barrier tape over the conductive layer above the nonporous tape, sandwiching the conductive layer therebetween;

(4) installing one or more structural plies over the mesh and barrier tape to a desired thickness;

(5) curing to form a composite article; and (6) removing the nonporous tape to expose an essentially resin free conductive mating surface.

2. The method of claim 1 wherein said conductive layer comprises a conductive metal mesh or metal foil ply.

3. The method of claim 1 wherein said conductive layer comprises aluminum metal mesh.

4. The method of claim 1 further comprising placing a composite face ply adjacent the nonporous tape for protecting the conductive layer.

5. The method of claim 1 wherein said structural plies comprises fiberglass, graphite or Kevlar fiber reinforced, resin impregnated composite plies.

6. The method of claim 1 wherein said nonporous tape comprises a copper foil with a Mylar facing and adhesive backing.

7. The method of claim 1 wherein the barrier tape comprises a low flow film adhesive.

8. The method, of claim 1 wherein the barrier tape comprises a Mylar tape with or without an adhesive peel ply backing.

9. A method for producing a composite article including a clean, highly conductive mating surface, said composite article including a continuous conductive layer for lightning or EMI shielding, said method comprising the steps of (1) placing a nonporous tape in a mold in an area requiring a clean, highly conductive mating surface; (2) placing a face composite ply adjacent to the nonporous tape; (3) overlaying the nonporous tape and face ply with at least one layer of conductive material; (4) placing a barrier tape over the conductive layer directly above the nonporous tape, sandwiching the conductive layer therebetween; (5) installing one or more structural plies over said underlying plies to a desire thickness; (6) curing to form a composite article; and, (7) removing the nonporous tape, exposing the clean, highly conductive mating surface.

10. The method of claim 9 wherein said conductive layer comprises a conductive metal mesh or metal foil ply.

11. The method of claim 9 wherein said conductive layer comprises aluminum metal mesh.

12. The method of claim 9 wherein said structural plies comprise fiberglass, graphite or Kevlar fiber reinforced, resin impregnated composite plies.

13. The method of claim 9 wherein said nonporous tape comprises a copper foil with a Mylar facing and adhesive backing.

14. The method of claim 9 wherein the barrier tape comprises a low flow film adhesive.

15. The method of claim 9 wherein the barrier tape comprises a Mylar tape with or without an adhesive peel ply backing.

16. In a method for producing a composite article which includes a clean, highly conductive mating surface for conductively bonding with adjacent structures, said article including a continuous conductive layer for lightning or EMI shielding, said method including the steps of installing a plurality of plies in a mold, vacuuming the plies to remove air and then curing the plies to form a composite article, the improvement which comprises: placing a nonporous tape in the mold in the area requiring a highly conductive mating surface; overlaying the nonporous tape with at least one layer of conductive material; placing a barrier tape over the conductive layer directly above the nonporous tape, sandwiching the conductive layer therebetween, and, after curing, removing the nonporous tape to expose a clean, highly conductive mating surface.

17. The method of claim 16 wherein said conductive layer comprises a conductive metal mesh or metal foil ply.

18. The method of claim 16 wherein said conductive layer comprises aluminum metal mesh.

19. The method of claim 16 further comprising placing a composite face ply adjacent the nonporous tape for protecting the conductive layer.

20. The method of claim 16 wherein said structural plies comprise fiberglass, graphite or Kevlar fiber reinforced, resin impregnated composite plies.

21. The method of claim 16 wherein said nonporous tape comprises a copper foil with a Mylar facing and adhesive backing.

22. The method fo claim 16 wherein the barrier tape comprises a low flow film adhesive.

23. The method fo claim 16 wherein the barrier tape comprises a Mylar tape with or without an adhesive peel ply backing.

* * * * *